United States Patent [19]

Mimura

[11] Patent Number: 4,958,201

[45] Date of Patent: Sep. 18, 1990

[54] RESONANT TUNNELING MINORITY CARRIER TRANSISTOR

[75] Inventor: Takashi Mimura, Machida, Japan

[73] Assignee: Fujitsu Limited, Kawasaki, Japan

[21] Appl. No.: 59,216

[22] Filed: Jun. 5, 1987

Related U.S. Application Data

[63] Continuation of Ser. No. 722,053, Apr. 11, 1985, abandoned.

[30] Foreign Application Priority Data

| Apr. 17, 1984 | [JP] | Japan | 59-075885 |
| Apr. 17, 1984 | [JP] | Japan | 59-075886 |
| May 31, 1984 | [JP] | Japan | 59-109436 |

[51] Int. Cl.$^5$ .................... H01L 29/205; H01L 29/72
[52] U.S. Cl. .......................... 357/16; 357/4; 357/12; 357/34
[58] Field of Search .................. 357/4, 12, 16, 34

[56] References Cited

FOREIGN PATENT DOCUMENTS

EP68064 1/1983 European Pat. Off.

OTHER PUBLICATIONS

Chang et al., Appl. Phys. Lett., vol. 24, No. 12, Jun. 15, 1974, pp. 593–595.
Ricco et al., IBM Technical Disclosure Bulletin, vol. 27, No. 5, pp. 3053–3056 (Oct. 1984).
Milnes and Feuche, Heterojunctions and Metal–Semiconductor Junctions (Academic Press, N.Y., 1972), p. 9.

Primary Examiner—William D. Larkins
Attorney, Agent, or Firm—Staas & Halsey

[57] ABSTRACT

A semiconductor device has an emitter potential barrier, a collector potential barrier, a base between the emitter potential barrier and the collector potential barrier, an emitter in contact, through the emitter potential barrier, with the base, and a collector in contact, through the collector potential barrier, with the base. The base has a thin base width capable of generating discrete energy levels of monority carriers therein. Carriers which are minority carriers in the base can be transferred from the emitter via the discrete energy levels in the base to the collector by resonant tunneling at an ultra-high speed.

39 Claims, 8 Drawing Sheets

RESONANT TUNNELING MINORITY CARRIER TRANSISTOR

This is a continuation of co-pending application Ser. No. 722,053 filed on Apr. 11, 1985 now abandoned.

BACKGROUND OF THE INVENTION

The present invention relates to a bipolar type semiconductor device (quantum base transistor: QBT) having an operating principle quite different from that of a conventional bipolar transistor, and able to operate at an ultra high speed.

In general, the operating principle of a bipolar semiconductor device is well known. Namely, the operating speed of a conventional bipolar transistor is limited by the diffusion time of electrons running through the transistor, as later described in more detail with reference to FIG. 1.

A fairly new operating principle of so-called "resonant tunneling" is also known, and is disclosed in, for example, "Resonant Tunneling in Semiconductor Double Barriers", by L. L. Chang, L. Esaki, and R. Tsu, in Applied Physics Letters, Vol. 24, No. 12, 15 June, 1974.

A three-pole semiconductor device based on the principle of resonant tunneling is disclosed in Japanese Unexamined Patent Publication (Kokai) No. 58-3277 published on Jan. 10, 1983, Applicant: International Business Machines Corporation, Inventor: L. Esaki, claiming priority based on U.S. application Ser. No. 280,141 filed on Feb. 5, 1982. The device disclosed in this reference deals with majority carriers which are transmitted from the emitter to the collector using the phenomenon of resonant tunneling by controlling the base potential. The emitter region, the base region, and the collector region are all of the same conduction type, i.e., having n-type conductivity.

SUMMARY OF THE INVENTION

An object of the present invention is to provide a semiconductor device for transmitting minority carriers therethrough at an ultra-high speed, using the phenomenon of resonant tunneling, at a small power consumption.

Another object of the present invention is to provide a semiconductor device having an npn or pnp transistor which can operate at an ultra high speed using the phenomenon of resonant tunneling.

Still another object of the present invention is to provide a semiconductor device having two transistors which can operate at an ultra-high speed using the phenomenon of resonant tunneling, the transistors constituting a complementary semiconductor device.

Yet another object of the present invention is to provide a semiconductor device which can operate at an ultra high speed using the phenomenon of resonant tunneling, in which the amplification factor is improved by preventing invalid base currents.

BRIEF DESCRIPTION OF THE DRAWINGS

The above objects and features of the present invention will be more apparent from the following description of the preferred embodiments with reference to the accompanying drawings, wherein.

DESCRIPTION OF THE PREFERRED EMBODIMENTS

Before describing the embodiments of the present invention, a conventional bipolar transistor will first be explained with reference to FIG. 1, for comparison with the embodiments of the present invention.

Figure 1:
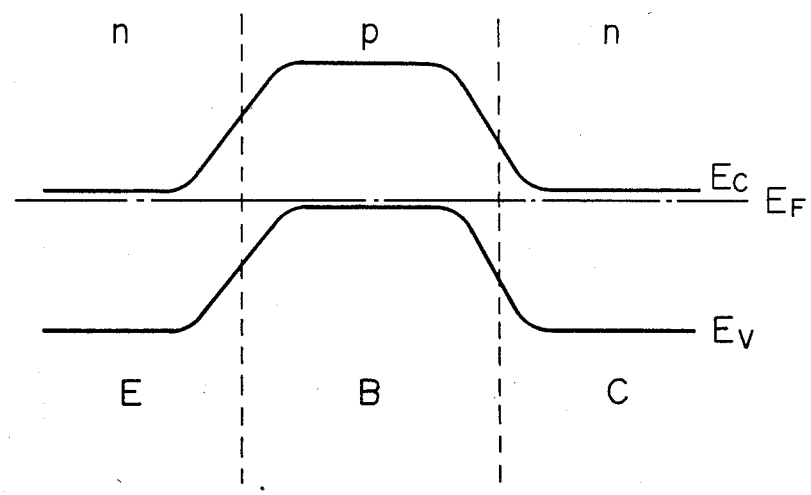
FIG. 1 is an energy band diagram of a conventional npn type bipolar semiconductor device.

FIG. 1 is an energy band diagram of a conventional npn type bipolar transistor. In the future, E represents an emitter, B a base, C a collector, $E_F$ the Fermi level, $E_V$ the highest energy level of a valence band, $E_C$ the lowest energy level of a conduction band, and n and p conductivity types.

The basic operating principle in such a conventional bipolar transistor is as follows.

Assume that a forward voltage is applied between the emitter E and the base B. Then, electrons injected from the emitter E into the base B travel through the base B due to thermal diffusion to reach the collector C, whereby a signal is transferred from the emitter E to the collector C.

Accordingly, the operating speed of this bipolar transistor is, ultimately, limited by the time necessary for the electrons to travel from the emitter E to the collector C, that is, the travelling time due mainly to thermal diffusion.

The present invention provides a semiconductor device comprising a quantum base transistor (QBT) capable of high speed operation without being limited by the travelling time due mainly to the above-mentioned thermal diffusion, and capable of having various characteristics in accordance with necessity.

The operating principle in the quantum base transistor of the present invention is quite different from that of the conventional bipolar semiconductor device. In the following, the operating principle is explained with reference to FIGS. 2 through 4.

Figure 2:
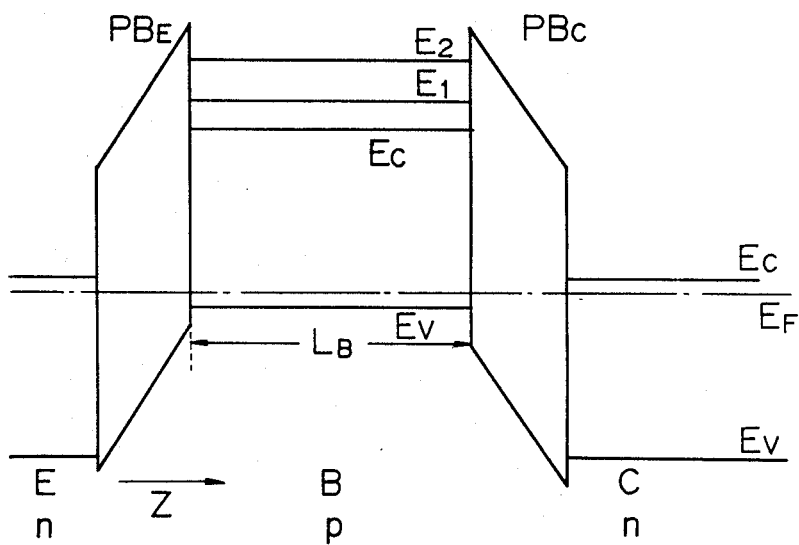
FIG. 2 is an energy band diagram showing a thermal equilibrium state of a semiconductor device according to a principle of the present invention.

FIG. 2 is an energy band diagram in a thermal equilibrium state of a quantum base transistor according to a principle of the present invention. Referring to FIG. 2, the quantum base transistor has an n-type emitter E, an emitter potential barrier $PB_E$, a p-type base B, a collector potential barrier $PB_C$, and an n-type collector C. Although the same reference symbols are provided for the emitter, the base, and the collector in both FIGS. 1 and 2, the emitter, the base, and the collector of the quantum base transistor shown in FIG. 2 are quite different from those of the conventional bipolar transistor shown in FIG. 1, as is later described in more detail. The reference symbols $E_F$, $E_V$, AND $E_C$ in FIG. 2 respectively represent the Fermi level, the highest energy level of the valence band, and the lowest energy level of the conduction band. $E_1, E_2, \ldots, E_n, \ldots$ represent discrete energy levels in the base B, $L_B$ the width (thickness) of the base B, and Z the direction of electrons travelling from the emitter E to the collector C.

The movement of minority carriers, i.e., electrons in this embodiment, in the base B between the emitter potential barrier $PB_E$ and the collector potential barrier $PB_C$ is substantially two dimensional, that is, in the Z direction and in the direction perpendicular to the Z direction, and the base B is set to be sufficiently thin, for example, 50 Å, so that the movement of electrons (carriers) in the Z direction can be quantized. The movement of electrons in the direction perpendicular to the Z direction is within a subband.

By making the base B sufficiently thin, the base B resembles a potential well, in which electrons directed from the emitter E to the collector C, that is, the electrons moving in the Z direction, can be moved only at certain special energy levels. That is, accompanied by the above-mentioned quantization, discrete energy levels $E_1, E_2, \ldots, E_n, \ldots$ are formed in the base B. When the potential barrier is assumed to be infinite, the energy level $E_n$ of the subband is approximately given as:

$$E_n = \frac{\pi \zeta^2 n^2}{2m^* L_B^2}$$

where,
$\zeta = h/2\pi$
h: Planck's constant
n: energy quantum number
$m^*$: effective mass of an electron
$L_B$: base width In such a quantum base transistor, when a forward voltage $V_{EB}$ is applied between the emitter E and the base B, then the energy band diagram is changed as shown in FIG. 3.

Figure 3:
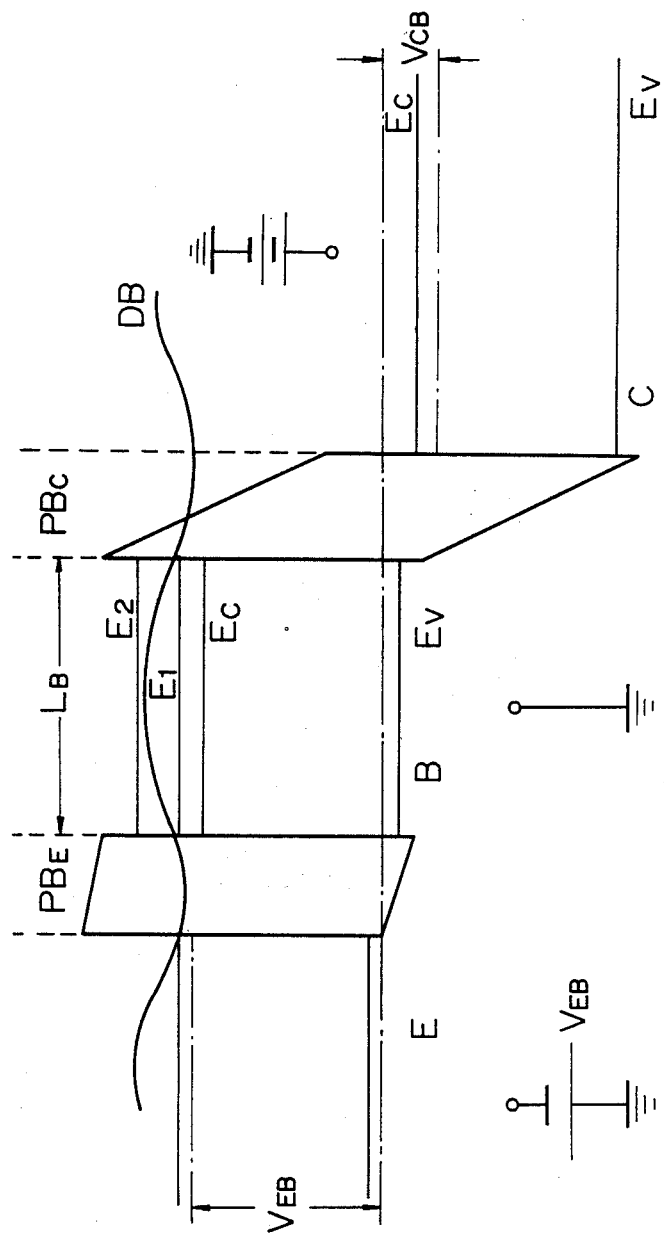
FIG. 3 is an energy band diagram showing an operating state of the semiconductor device according to the principle of the present invention.

In FIG. 3, the same portions as those explained with reference to FIG. 2 are indicated by the same symbols.

In the figure, $V_{EB}$ represents the voltage between the base B and the emitter E, $V_{CB}$ the voltage between the collector C and the base B, and DB the de Broglie wave. The base potential is the ground potential, the voltage $V_{EB}$ is a negative voltage, and the voltage $V_{CB}$ is a positive voltage. The thickness of the emitter potential barrier $PB_E$ and the thickness of the collector potential barrier $PB_C$ are respectively selected in such a manner that electrons can travel by tunneling therethrough.

Where the voltages are applied as described above, and when electrons having the same energy as the energy level, for example, $E_1$, are injected from the emitter E in the Z direction, these electrons reach the collector C with a transmission factor of 1, i.e., a complete transmission, as shown by the de Broglie wave. As is well known, electrons in a thin region having a size on the order of the wavelength of an electron behave as the de Broglie wave rather than as a corpuscular particle. The de Broglie wave is within a subband and travels in the Z direction with a discrete energy $E_1, E_2, \ldots$.

In the process for the electrons going from the emitter E to the collector C, the transition is caused not by the conventional conduction due to diffusion but by tunneling through two potential barriers, i.e., by resonant tunneling. The transfer of electrons by resonant tunneling is effected at an ultra-high speed in comparison with the transfer by thermal diffusion.

To operate the quantum base transistor as a transistor, it is necessary only to align the energy level of the electrons in the emitter with one of the discrete energy levels $E_1, E_2, \ldots, E_n, \ldots$. This alignment is realized by adjusting the emitter-base voltage $V_{EB}$.

In principle, no base current is necessary, whereas a certain collector current is obtained. Accordingly, assume that the base B is an input and the collector C is an output, then the quantum base transistor is, in principle, an amplifier having an infinite current amplification factor.

In practice, however, an electrostatic capacitance is formed between the emitter E and the base B. Therefore, to charge up the electrostatic capacitance, a displacement current flows through the electrostatic capacitance. This displacement current is a loss in the quantum base transistor. Nevertheless, the quantum base transistor according to the present invention has a considerably large current amplification factor regardless of the presence of the displacement current. In general, the output power is represented by the product of the collector current and the collector-base voltage $V_{CB}$.

If the absolute value of the base-emitter voltage $V_{EB}$ is increased so as to align the lowest energy level $E_C$ of the conduction band in the emitter E with an energy level between the energy levels $E_1$ and $E_2$ in the base B, then the transmission factor of the electrons in the base becomes "0", that is, the electrons from the emitter E are completely reflected at the interface between the emitter potential barrier $PB_E$ and the base B, with the result that the collector current becomes zero.

When the absolute value of the base-emitter voltage $V_{EB}$ is further increased so that the lowest energy level $E_C$ of the conduction band in the emitter E is aligned with the second energy level $E_2$ in the base B, resonant tunneling is again effected and the electrons are, in principle, completely transferred from the emitter to the collector, resulting in a collector current which is not zero.

Thus, as described above, the quantum base transistor according to the present invention has an ultra high speed of operation due to resonant tunneling. A Different from the device disclosed in the Japanese Unexamined Patent Publication (Kokai) No. 58-3277above is that the transferred carriers in this embodiment are electrons which are minority carriers in the p-type base B. In addition, the quantum base transistor in this embodiment has an npn structure which is different from the conventional nnn structure disclosed in the above reference. Further, the quantum base transistor according to the present invention has a strong nonlinearity which can realize various functions.

Figure 4:
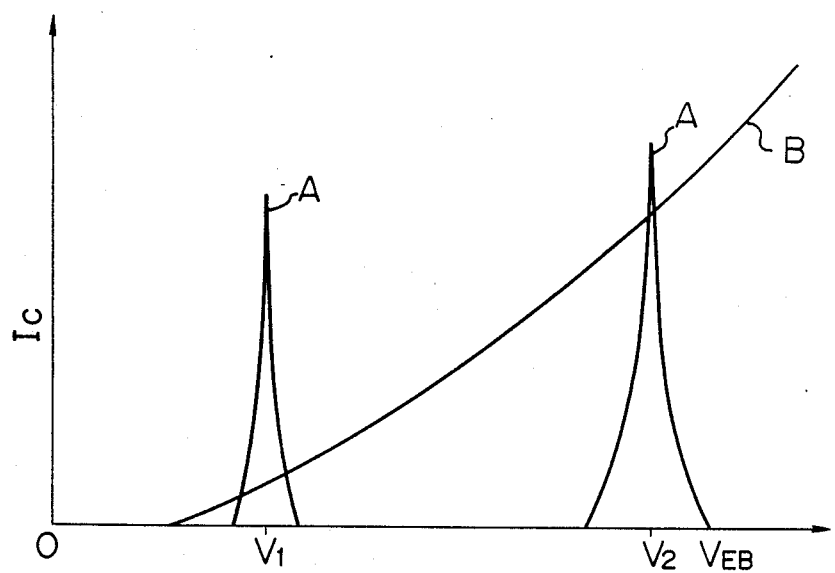
FIG. 4 is a diagram illustrating transfer characteristics of the semiconductor device according to the principle of the present invention, in comparison with transfer characteristics of the conventional npn bipolar semiconductor device.

FIG. 4 is a diagram illustrating transfer characteristics of the quantum base transistor according to the principle of the present invention, in comparison with transfer characteristics of the conventional npn bipolar transistor. In FIG. 4, the vertical axis represents the collector current $I_c$, and the horizontal axis represents the emitter-base voltage $V_{EB}$. Curve A shows the characteristic curves of the quantum base transistor, and curve B shows the characteristic curve of the conventional bipolar transistor. Voltages $V_1$ and $V_2$ respectively represent emitter-base voltages for aligning the lowest energy level of the conduction band $E_C$ in the emitter E of the quantum base transistor with the discrete energy levels $E_1$ and $E_2$ in the base B.

As will be seen from FIG. 4, the collector current $I_c$ in the conventional bipolar transistor increases with increase of the emitter-base voltage $V_{EB}$. On the contrary, in the quantum base transistor, a spike-like collector current $I_c$ is generated only when the emitter-base voltage $V_{EB}$ coincides with the voltage $V_1$ or $V_2$. The spike-like collector current $I_c$ has this remarkable nonlinearity characteristic with respect to the emitter-base voltage. That is, before the emitter-base voltage $V_{EB}$ reaches the voltage $V_1$ or $V_2$, the collector current $I_c$ increases, along with the increase of the emitter-base voltage $V_{EB}$ at a very high rate in comparison with the case of the conventional bipolar transistor, and after the emitter-base voltage $V_{EB}$ reaches the voltage $V_1$ or $V_2$, the collector current $I_c$ decreases, along with the increase of the voltage $V_{EB}$, at a very high rate. The remarkable nonlinearity characteristic and the selective transfer characteristic as mentioned above can be effective not only for realizing conventional binary logic circuits but also for realizing highly functional logic circuits such as a multi-value logic circuit.

Embodiments of the present invention will be described in the following.

Figure 5:
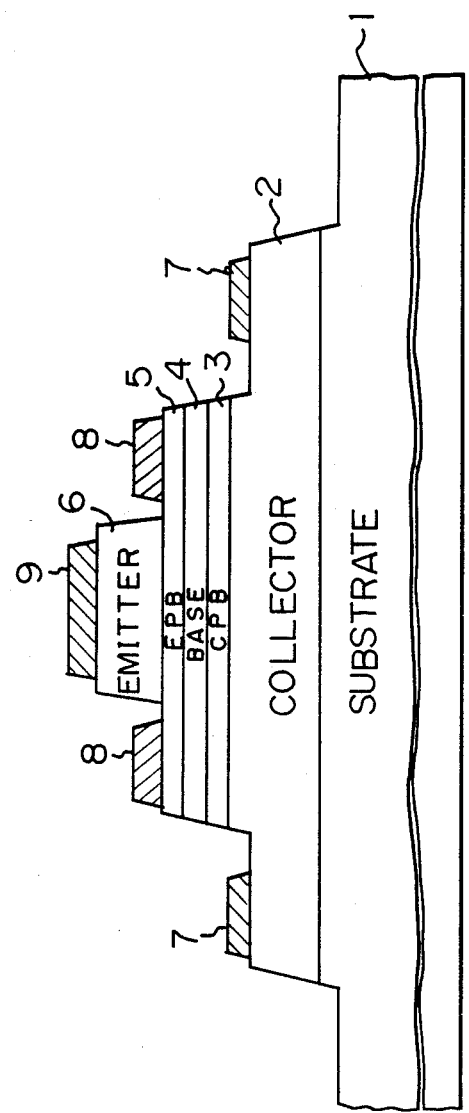
FIG. 5 is a cross-sectional view of a principal structure of the semiconductor device according to an embodiment of the present invention.

FIG. 5 is a cross-sectional view of a quantum base transistor according to a first embodiment of the present invention. In FIG. 5, a collector 2 is formed on a semi-insulating GaAs substrate 1, a collector-potential barrier (CPB) 3 is formed on the collector 2, a base 4 is formed on the CPB 3, and an emitter-potential barrier (EPB) 5 is formed on the base 3. An emitter 6 is formed on the emitter-potential barrier 5, and a collector electrode 7 made of gold.germanium/gold (Au.Ge/Au) is formed on the collector 2 so as to be in ohmic contact with the collector 2. The notation Au.Ge/Au represents a state wherein an alloy Au.Ge is covered by a layer of Au. A base electrode 8 made of gold.zinc/gold (Au.Zn/Au) is formed on the base 8 so as to be in ohmic contact with the base 4. The term Au Zn/ Au represents a state wherein an alloy Au Zu is covered by a layer of Au. An emitter electrode 9 made of gold germanium/gold (Au.Ge/Au) is formed on the emitter 6 so as to be in ohmic contact with the emitter 6.

The combination of the material in the first embodiment shown in FIG. 5 is as follows.

(1) Emitter 6
  Semiconductor: n-type GaAs (gallium arsenic)
  Dopant concentration: $4 \times 10^{18}$ [cm$^{-3}$]
  Dopant: Si (silicon)
  Thickness: 1 [$\mu$m]

(2) Emitter potential barrier 5
  Semiconductor: p-type Al$_{0.3}$Ga$_{0.7}$As
  Dopant concentration: $2 \times 10^{19}$ [cm$^{-3}$]
  Dopant: Be (beryllium)
  Thickness 20[Å]

(3) Base 4
  Semiconductor: p-type GaAs
  Dopant concentration: $2 \times 10^{19}$ [cm$^{-3}$]
  Dopant: Be
  Thickness: 50 [Å]

(4) Collector potential barrier 3
  Semiconductor: p-type Al$_{0.3}$Ga$_{0.7}$As
  Dopant concentration: $2 \times 10^{19}$ [cm$-3$]

(5) Collector 2
  Semiconductor: n-type GaAs
  Dopant concentration: $4 \times 10^{17}$ [cm$-3$]
  Dopant: Si
  Thickness: 1 [$\mu$m]

The interfaces between the collector 2 and the collector potential barrier 3, between the collector potential barrier 3 and the base 4, between the base 4 and the emitter potential barrier 5, and between the emitter potential barrier 5 and the emitter 6 are heterojunctions in the first embodiment of the present invention.

In the above embodiment, the conductivity type of the emitter potential barrier 5 or the collector potential barrier 3 is made p-type. The potential barrier 3 or 5 is formed as the p-type to prevent the thin base from being filled with the depletion layer extending from the pn junction between the collector 2 or the emitter 6 and the collector potential barrier 3 or the emitter potential barrier 5. In place of the p-type potential barrier 3 or 5, according to a second embodiment of the present invention, an intrinsic layer may be employed as the potential barrier if the dopant concentration in the collector 2 is lowered to be about $2 \times 10^{17}$ [cm$^{-3}$]or the dopant concentration in the emitter 6 is lowered to be about $2 \times 10^{15}$ [cm$-3$]. This constitution ensures that the depletion layer is extended in the emitter side or the collector side in such a manner that formation of a depletion layer within the base 4 is prevented.

The structure of the quantum base transistor of a second embodiment discussed below is not shown in the drawing but is similar to that shown in FIG. 5. Namely, as a modification of the structure shown in FIG. 5, the collector 2 may be replaced by an emitter and the emitter 6 may be replaced by a collector, according to another embodiment of the present invention.

The outline of the manufacturing process of the quantum base transistor of the first embodiment is as follows.

(a) First, the n-type GaAs collector 2, the p-type Al$_{0.3}$Ga$_{0.7}$As collector potential barrier 3, the p-type GaAs base 4, the p-type Al$_{0.3}$Ga$_{0.7}$As emitter potential barrier 5, and the n-type GaAs emitter 6 are sequentially grown on the semi-insulating GaAs substrate 1 by, for example, molecular beam epitaxy (MBE). The n-type GaAs emitter 6 has a thickness of, for example, about 1[$\mu$m]to be sufficient to prevent the emitter electrode 9 from punching through the n-type GaAs emitter 6 during thermal processing for alloying the emitter electrode 9 with the emitter 6. However, if the impurity concentration in the n-type GaAs emitter is sufficiently high, the above-mentioned thermal processing is not necessary, and accordingly, the thickness of the n-type GaAs emitter 6 can be made thinner than the above example.

(b) Mesa etching is carried out for isolating elements from each other by using, for example, hydrofluoric acid (HF) type etchant. This mesa etching is effected from the top to reach the semi-insulating GaAs substrate in such a manner that the quantum base transistor is electrically isolated from other elements or other quantum base transistors.

(c) A first photoresist film (not shown) having a base pattern is formed. By using the photoresist film as a mask, and by using a hydrofluoric acid (HF) type etchant, mesa etching is effected in such a manner that the etchant reaches the n-type GaAs collector 2. Thus, the collector potential barrier 3, the base 4, the emitter potential barrier 5, and the emitter 6 are selectively removed.

(d) A second photoresist film (not shown) having openings is formed to cover the entire surface of the device. The openings are provided at positions where the emitter electrode 9 and the collector electrode 7 are to be formed.

(e) An Au.Ge/Au film is formed to cover the entire surface of the device by applying vaporisation. To pattern the Au.Ge/Au film, the above-mentioned second photoresist film is melted and removed by means of a lift-off technique. Then, an alloying process is effected to form the collector electrode 7 and the emitter electrode 9.

(f) To form the base electrode 8, a third photoresist film (not shown) is formed to cover the entire surface of the device. Then, by applying dry etching using $CCl_2F_2$-type etchant, the emitter 6 is selectively removed.

(g) An Au.Ge/Au film is formed to cover the entire surface of the device by applying vacuum evaporation. To pattern the Au.Ge/Au film, the third photoresist film is melted and removed by means of a lift-off technique. Then an alloying process is effected to form the base electrode 8.

The manufacturing process of the second embodiment is similar to that of the first embodiment.

The thusly formed quantum base transistor according to the first or second embodiments operates under the operating principle described with reference to FIGS. 3 and 4.

It is to be noted that the indispensable points in the semiconductor device according to the present invention are:

(a) discrete energy levels of minority carriers should be formed in the base 4; and (b) the collector potential barrier 3 and the emitter potential barrier 5 should have thicknesses capable of allowing a tunnel effect.

Therefore, the constitution of material is not limited to the above mentioned example as described in items (1) through (5), but may be any constitution as long as the above mentioned indispensable points (a) and (b) are satisfied.

Also, the conduction type of the base 4 need not be the p-type as in the above described first or second embodiments, but may be an n-type. If the base 4 is formed as the n-type, then the conductivity type of the emitter 6 and the collector 2 should of course be p-type.

Figure 6:
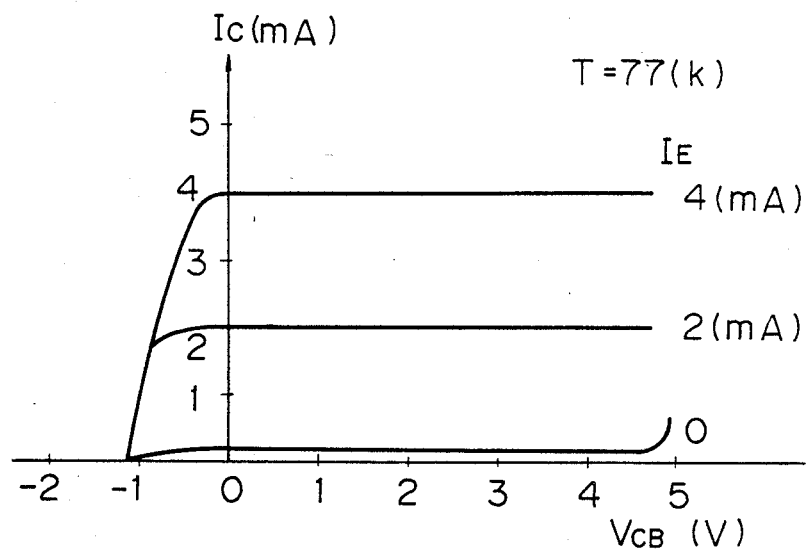
FIG. 6 is a diagram illustrating common base collector characteristics of the semiconductor device shown in FIG. 5.
Figure 7:
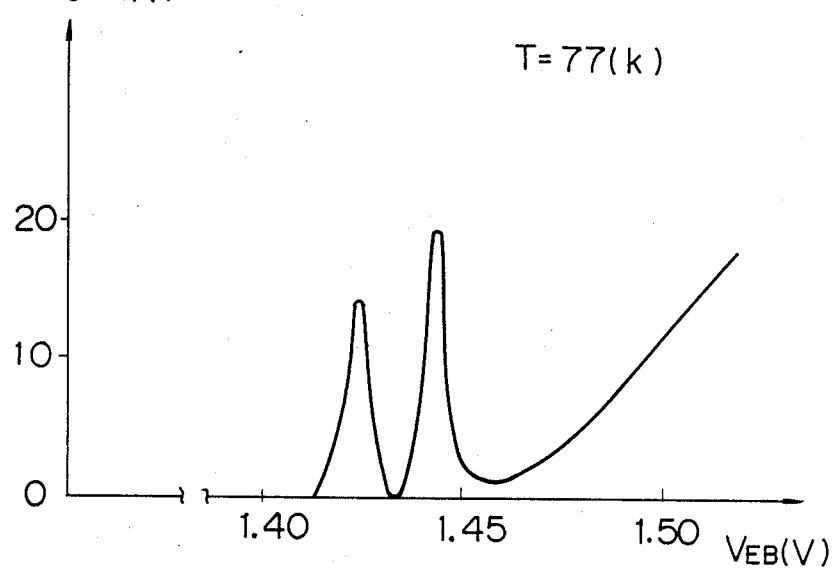
FIG. 7 is a diagram illustrating transfer characteristics of the semiconductor device shown in FIG. 5.

FIGS. 6 and 7 are diagrams showing electrical characteristics obtained from the quantum base transistor according to the first or the second embodiments described above with reference to FIG. 5.

FIG. 6 shows a common base collector characteristic of the quantum base transistor. In FIG. 6, the vertical axis represents the collector current $I_c$, and the horizontal axis represents the collector-base voltage $V_{CB}$. The emitter current $I_E$ is a parameter. Note, the temperature T at which the data shown in FIG. 6 were obtained was 77[K].

As can be seen from FIG. 6, when the emitter current $I_E$ is zero, then the collector current $I_C$ is almost equal to zero. Therefore, the emitter current $I_E$ is almost equal to the collector current. This means that the base current is very small, and therefore, the current amplification factor $\beta$ is very large.

Next, various other embodiments different from the first or the second embodiment are described. FIG. 5 can also be applied to these other embodiments.

A. Embodiments having semiconductor hetero-junctions:

Third embodiment
(1) Emitter 6: Ge
(2) Emitter potential barrier 5: GaAs
(4) Base 4: Ge
(5) Collector potential barrier 3: GaAs
(5) Collector 2: Ge Fourth embodiment
(1) Emitter 6: $Si_{1-x}Ge_x$
(2) Emitter potential barrier 5: Si
(3) Base 4: $Si_{1-x}Ge_x$
(4) Collector potential barrier 3: Si
(5) Collector 2: $Si_{1-x}Ge$ Fifth embodiment
(1) Emitter 6: $Al_xGa_{1-x}As$
(2) Emitter potential barrier 5: $Al_yGa_{1-y}As$
(3) Base 4: $Al_zGa_{1-z}As$
(4) Collector potential barrier 3: $Al_vGa_{1-v}As$
(5) Collector 2: $Al_uGa_{1-u}As$ Sixth embodiment
(1) Emitter 6: InSb
(2) Emitter potential barrier 5: CdTe
(3) Base 4: InSb
(4) Collector potential barrier 3: CdTe
(5) Collector 2: InSb Seventh embodiment
(1) Emitter 6: InAs
(2) Emitter potential barrier 5: GaSb
(3) Base 4: InAs
(4) Collector potential barrier 3: GaSb
(5) Collector 2: InAs In all of the above embodiments, it is necessary that the energy gap in the emitter potential barrier 5 or in the collector potential barrier 3 be greater than the energy gap in the base 4, and that the lattice constants of the emitter 6, the emitter potential barrier 5, the base 4, the collector potential barrier 3, and the collector are sufficiently close to each other so as to be able to form vertical interfaces between E and $PB_E$, $PB_E$ and B, B and $PB_C$, and $PB_C$ and C. As long as the above conditions are satisfied, any material other than the above-mentioned material can be appropriately selected for manufacturing a quantum base transistor. In the present invention, not only the above mentioned heterojunctions but also various other junctions can be employed. For example, the material may be semiconductive and insulative as long as the above conditions are satisfied. Further, the emitter 6 may be made of pure metal, since the emitter 6 should have only a function for supplying minority carriers of the base.

Next, the various embodiments as described above are explained. FIG. 5 is also applied to these embodiments.

B. Eighth embodiment having semiconductor-insulator junctions (1) Emitter 6
  Semiconductor: n-type Si
  Dopant concentration: $10^{19}$ [cm$^{-3}$]
  Dopant: As
  Thickness: 1 [μm]
(2) Emitter potential barrier 5
  Material: SiO$_2$ (silicon dioxide)
  Thickness: 20 [Å]
(3) Base 4
  Semiconductor: p-type Si
  Dopant concentration: $4 \times 10^{19}$ [cm$^{-3}$]
  Dopant: B (boron)
  Thickness: 50 [Å]
(4) Collector potential barrier 3
  Material SiO$_2$
  Thickness: 20 [Å]
(5) Collector 2
  Semiconductor: n-type Si
  Dopant concentration: $5 \times 10^{18}$ [cm$^{-3}$]
  Dopant: As
  Thickness: 1 [μm]

The manufacturing process of the abovementioned semiconductor-insulator semiconductor device is as follows.

(a) The n-type collector 2 is formed on the Si substrate by an MBE process.

(b) The device is moved into a plasma oxidation chamber without being exposed to air. Then the device is subjected to plasma oxidation so that the collector potential barrier 3 made of SiO$_2$ is formed on the collector 2. During this process, the pressure 5 in the oxidation chamber may be $10^{-3}$ [Torr] and the energy may be 100 [W].

During the growing of the collector potential barrier 3 of SiO$_2$ by oxidation, the thickness of the collector potential barrier can always be detected in a so-called "in-situ" fashion by applying the elipsometry method used for measuring the thickness of an oxidation film in the manufacture of, for example, a Josephson element. The oxidation of the collector potential barrier 3 is continued until the thickness thereof reaches the designed value, i.e., 20 [Å].

(c) Again, the p-type Si base 4 is formed by an MBE process.

In this process, silicon is formed as polycrystalline silicon or amorphous silicon. However, the polycrystalline or amorphous silicon can be easily changed to a monocrystalline silicon by an electron-beam annealing or laser annealing technique.

(d) Then, the emitter potential barrier 5 is formed by the same process as the above-mentioned process (b).

(e) The patterning process of the semiconductor or insulator or the formation of the electrodes are effected in the same way as the manufacturing process of the conventional bipolar semiconductor device. Thus, the semiconductor-insulator quantum base transistor according to the eighth embodiment of the present invention is completed.

C. Ninth embodiment having a metal emitter

As mentioned before, the emitter 6 may be made of metal. In this case, the material combinations are as follows.
(1) Emitter 6
  Material: Al (aluminum)
  Thickness: 1 [μm]
(2) Emitter potential barrier 5
  Material: SiO$_2$
  Thickness: 20 [Å]
(3) Base 4
  Semiconductor: p-type Si
  Dopant concentration: $4 \times 10^{19}$ [cm$^{-3}$]
  Dopant: B
  Thickness: 50 [Å]
(4) Collector potential barrier 3
  Material: SiO$_2$
  Thickness: 20 [Å]
(5) Collector 2
  Semiconductor: n-type Si
  Dopant Concentration: $5 \times 10^{18}$ [cm$^{-3}$]
  Dopant: As
  Thickness: 1 [μm]

Figure 8:
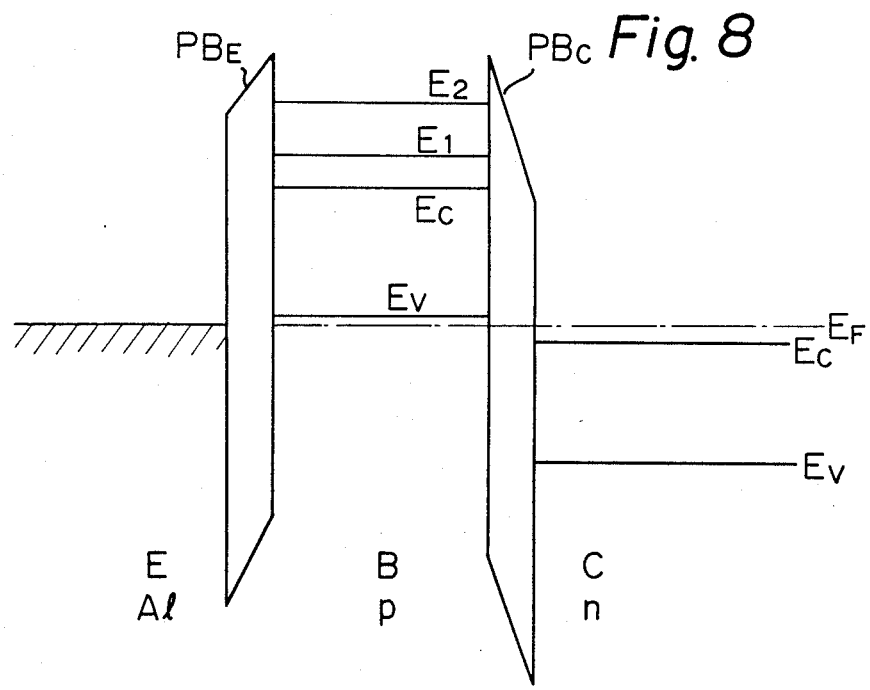
FIG. 8 is an energy band diagram showing a thermal equilibrium state of a semiconductor device according to another embodiment of the present invention.

FIG. 8 shows an energy band diagram of the ninth embodiment described above having the metal emitter. In FIG. 8, the same reference symbols as those in FIGS. 2 and 3 are used to represent the corresponding portions. However, in practice, the material constitution is different from the other foregoing embodiments, and the energy levels $E_1$, $E_2$, $E_V$, $E_C$, $E_F$ are drawn as straight lines, and bending portions near the interfaces between two layers are omitted for the sake of simplicity.

In FIG. 8, the emitter E is made of Al (aluminum), the base B is a p-type semiconductor, the collector C is an n-type Si, and the emitter potential barrier $PB_E$ and the collector potential barrier $CB_E$ are made of SiO$_2$ as mentioned before.

By employing aluminum as the material of the emitter E, the resistance in the emitter can be reduced and a fine emitter can be easily formed. Note that the emitter E made of metal has no energy band.

The manufacturing process of the ninth embodiment C is quite similar to that of the before-described embodiments B having the semiconductor-insulator junctions.

As described before, the quantum base transistor according to any one of the foregoing embodiments has various superior characteristics in comparison with the conventional bipolar transistor. However, an improvement can be made to the above-described quantum base transistor.

Figure 9:
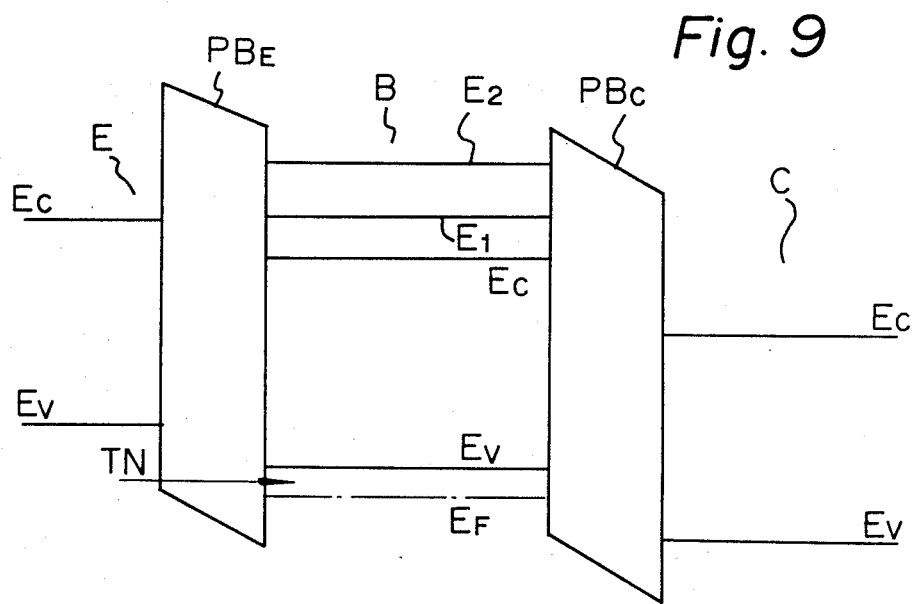
FIG. 9 is an energy band diagram showing an operating state of a semiconductor device according to the first embodiment of the present invention, for explaining a point to be improved.

FIG. 9 is an energy band diagram showing an operating state of the quantum base transistor according to the first embodiment of the present invention, for explaining the point to be improved. The same reference symbols as those used in FIG. 3 are provided to the same portions in FIG. 9. The degenerated base B in FIG. 9 has the discrete energy levels $E_1$, $E_2$, . . . in the same way as in the energy band diagram of FIG. 3. The lowest energy level of the conduction band $E_C$ is aligned with the discrete energy level $E_1$ in the base B in the same way as in FIG. 3.

Assume that the energy gap between the conduction band $E_C$ and the valence $E_V$ in the emitter E is equal to or smaller than the energy gap in the base B. Then, the highest energy level of the valence band $E_V$ in the emitter is higher than the quasi-Fermi level $E_F$ in the base B or the highest energy level of the valence band $E_V$ in the base B. Accordingly, valence electrons in the valence band $E_V$ of the emitter E tunnel through the emitter potential barrier $PB_E$ into the valence band $E_V$ of the base B, as indicated by an arrow TN. This phenomenon is equivalent to that wherein the holes in the base B, i.e., majority carriers in the base B, are injected into the emitter E, resulting in an invalid current. Due to the injection of the holes from the base B to the emitter E, the current amplification factor $h_{FE}$ of the quantum base transistor of the first embodiment is deteriorated.

According to the tenth embodiment of the present invention, the above-mentioned problem in the first embodiment is resolved by providing a new emitter which has an energy gap greater than the energy gap in the base B. By this constitution, the highest energy level of the valence band in the emitter becomes lower than the quasi-Fermi level in the base B or valence band in the base B so that the valence electrons in the emitter are prevented from tunneling into the base B. As a result, holes in the base B are not injected into the base B, and thus the current amplification factor is improved.

The structure of the quantum base transistor having the wide energy gap in its emitter is similar to the structure of the first embodiment shown in FIG. 5 except for the wide energy gap in the emitter. The wide energy gap can be realized by introducing aluminum in the emitter E of the quantum base transistor of the first embodiment.

An example of the material combinations in the tenth embodiment is as follows.

Tenth embodiment
  (1) Emitter
    Semiconductor: $Al_XGa_{1-X}As$
    Thickness: 1 [μm]
    Dopant concentration: $1 \times 10^{18}$ [cm$^{-3}$]
    Dopant: Si
  (2) Emitter potential barrier
    Semiconductor: $Al_YGa_{1-Y}As$, where $X<Y$
    Thickness: 20 [Å]
    Dopant concentration: $2 \times 10^{19}$ [cm$^{-3}$]
    Dopant: Be
  (3) Base
    Semiconductor: GaAs
    Thickness: 50 [Å]
    Dopant concentration: $2 \times 10^{19}$ [cm$^{-3}$]
    Dopant: Be
  (4) Collector potential barrier
    Semiconductor: $Al_ZGa_{1-Z}As$
    Thickness: 20 [Å]
    Dopant concentration: $2 \times 10^{18}$ [cm$^{-3}$]
    Dopant: Be
  (5) Collector
    Semiconductor: GaAs
    Dopant concentration: $2 \times 10^{18}$ [cm$^{-3}$]
    Dopant: Si The manufacturing process for forming the quantum base transistor of the tenth embodiment is quite similar to that described for the first embodiment, and therefore, is not described here.

In the tenth embodiment, the amount of aluminum in the emitter may be any value as long as the condition $X<Y$ is satisfied. For example, when $X=0.2$ and $Y=1$, the emitter E formed by $Al_{0.2}Ga_{0.8}As$ has an energy gap equal to 1.7 eV; and the emitter potential barrier $PB_E$ formed by AlAs has an energy gap equal to 2.3 eV. Whereas, the base B formed by GaAs has an energy gap equal to 1.4 eV.

Figure 10:
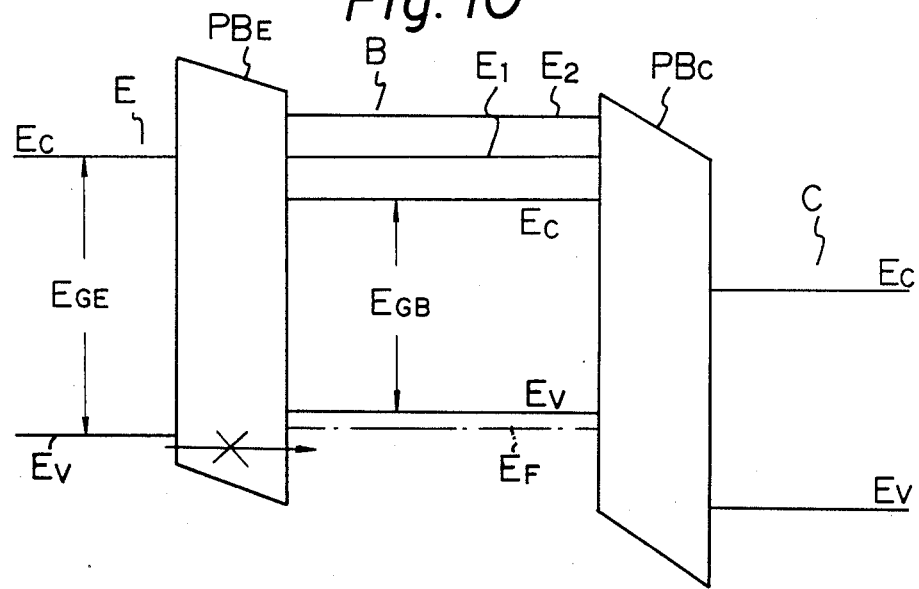
FIG. 10 is an energy band diagram showing an operating state of a semiconductor device according to still another embodiment of the present invention in which the above point is improved.

FIG. 10 is an energy band diagram showing an operating state of the quantum base transistor according to the tenth embodiment of the present invention. The same reference symbols as those used in FIG. 9 are provided to the corresponding portions in FIG. 10.

As can be seen from FIG. 10, when the lowest energy level of the conduction band $E_C$ in the emitter E is aligned with the discrete energy level $E_1$ in the base B, then the highest energy level of the valence band $E_V$ in the emitter E becomes lower than the quasi-Fermi level $E_F$ in the base B or lower than the valence band $E_V$ in the base B. Therefore, valence electrons in the emitter E cannot tunnel through the emitter potential barrier $PB_E$ into the base B, with the result that the majority carriers, i.e., holes, in the base B are not injected into the emitter E. Thus, no invalid current flows. As a result, the current amplification factor of the quantum base transistor according to the tenth embodiment of the present invention is improved by about one order, resulting in a current amplification factor of about 3000 through 5000.

In the foregoing various embodiments, the thickness of the base may be in the range between 20 angstroms and 200 angstroms; the thickness of the emitter potential barrier may be in the range between 10 angstroms and 200 angstroms; and the thickness of the collector potential barrier may be in the range between 10 angstroms and 299 angstroms.

The foregoing various embodiments are summarized in the following table.

| Embodiments | E | EPB | B | CPB | C |
|---|---|---|---|---|---|
| 1 | n—GaAs (1 μm) | p—AlGaAs (20 Å) | p—GaAs (50 Å) | p—AlGaAs (20 Å) | n—GaAs (1 μm) |
| 2 | n—GaAs (1 μm) lower concentration | i-layer (20 Å) | p—GaAs (50 Å) | i-layer (20 Å) | n—GaAs (1 μm) lower concentration |
| 3 | Ge | GeAs | Ge | GeAs | Ge |
| 4 | SiGe | Si | SiGe | Si | SiGe |
| 5 | AlGaAs | AlGaAs | AlGaAs | AlGaAs | AlGaAs |
| | Amount of Al is different in each case | | | | |
| 6 | InSb | CdTe | InSb | GaSb | InAs |
| 7 | InAs | GaSb | InAs | GaSb | InAs |
| 8 | n—Si (1 μm) | SiO$_2$ (20 Å) | p—Si (50 Å) | SiO$_2$ (20 Å) | n—Si (1 μm) |
| 9 | Al (1 μm) | SiO$_2$ (20 Å) | p—Si (50 Å) | SiO$_2$ (20 Å) | n—Si (1 μm) |
| 10 | AlGaAs | AlGaAs | GaAs | AlGaAs | GaAs |
| | Amount of Al is different | | | Amount of Al is different | |

Now, an eleventh embodiment of the present invention will be described with references to FIGS. 11 and 12.

Figure 11:
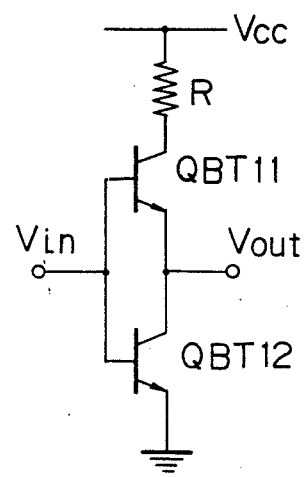
FIG. 11 is a circuit diagram of a semiconductor device according to still another embodiment of the present invention.

FIG. 11 is a circuit diagram of a semiconductor device according to the eleventh embodiment of the present invention. In FIG. 11, two quantum base transistors QBT11 and QBT12 are connected in series. These transistors QBT11 and QBT12 are respectively obtained from any one of the before-described first through tenth embodiments. According to the eleventh embodiment, the discrete energy levels in the base B of the first transistor QBT11 are made different from those of the second transistor QBT12. The collector of the first transistor QBT11 is connected through a resistor R to a positive power supply $V_{cc}$. The bases of the transistors QBT11 and QBT12 are commonly connected to an input terminal $V_{in}$ for receiving an input signal. The emitter of the transistor QBT11 and the collector of the transistor QBT12 are commonly connected to an output terminal $V_{out}$ for outputting an output signal. The emitter of the second transistor QBT12 is grounded.

Figure 12:
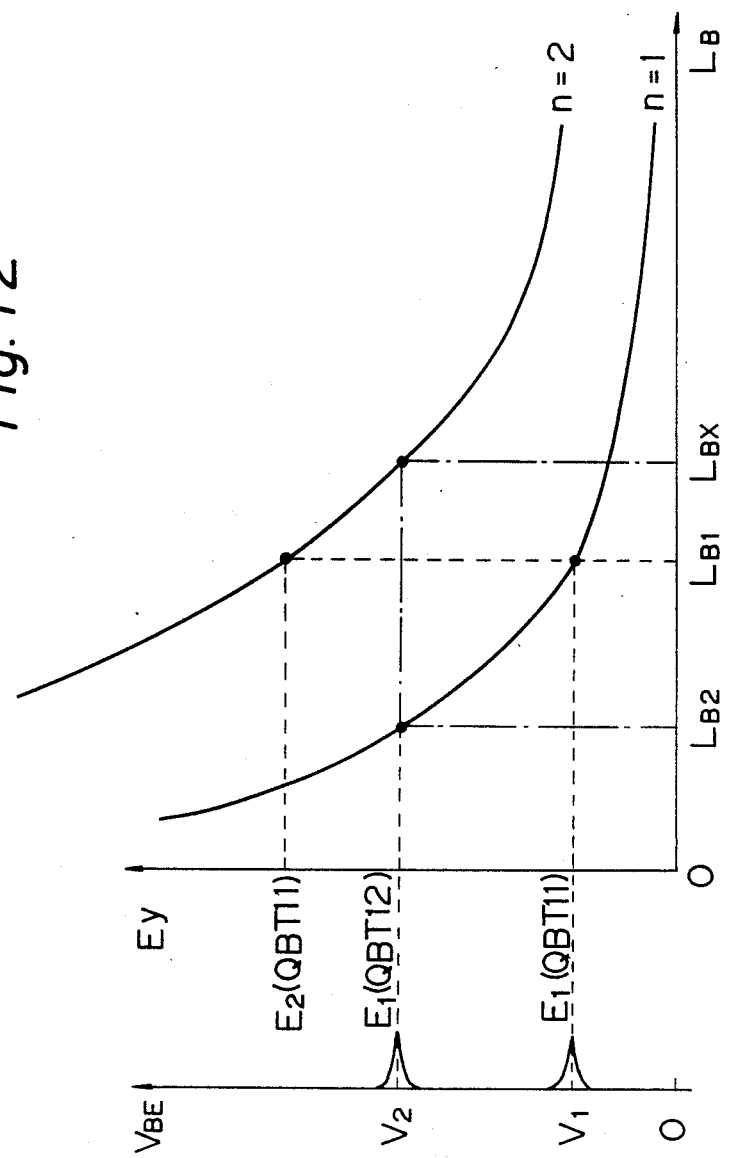
FIG. 12 is a graph diagram illustrating a relationship between the base widths and the energy levels in the semiconductor device shown in FIG. 11.

FIG. 12 is a graph diagram illustrating a relationship between the base widths and the energy levels in the semiconductor device shown in FIG. 11.

In FIG. 12, the horizontal axis represents the base width $L_B$, and the vertical axis represents the energy level $E_y$ in the base, of a quantum base transistor according to any one of the embodiments. As described before, the relationship between the energy level $E_n$ and the base width $L_B$ can be expressed as:

$$E_n = \frac{\pi \xi^2 n^2}{2m^* L_B^2}$$

FIG. 12 shows two curves for n=1 and n=2. $L_{B2}$ represents the base width of the second transistor QBT12. $L_{BX}$ represents a base width of a quantum base transistor having an energy level $E_2$ for n=2 which coincides with the energy level $E_1$, for n=1, for the second transistor QBT12. The base width $L_{B1}$ of the first transistor QBT11 must be larger than the base width $L_{B2}$ and smaller than the base width $L_{BX}$. When the base widths are so determined, the ground state energy level $E_1$(QBT11), for n=1, of the first transistor QBT11 is lower than the ground state energy level $E_1$(QBT12), for n=1, of the second transistor QBT12; and the ground state energy level $E_1$(QBT12), for n=1, of the second transistor QBT12 is lower than the excited state energy level $E_2$(QBT11), for n=2, of the first transistor QBT11.

The operation of the circuit shown in FIG. 11 is described with reference to FIG. 12.

When the voltage at the input terminal $V_{in}$ corresponds to a low voltage $V_1$, the energy level of electrons in the emitter of the first transistor QBT11 is aligned with the energy level $E_1$ in the base of the first transistor QBT11 so that only the first transistor QBT11 is turned on. In this state, the voltage at the output terminal $V_{out}$ is a high level, i.e., $V_{out}=V_{cc}-I_c \cdot R$, wherein $V_{out}$ is the voltage at the output terminal $V_{out}$, $V_{cc}$ is the voltage of the power supply $V_{cc}$, R is the resistance of the resistor R, and $I_c$ is the collector current flowing through QBT11. The second transistor QBT12 in this state is in an off state.

When the input voltage $V_{in}$ corresponds to a high voltage $V_2$, the energy level of electrons in the emitter of the second transistor QBT12 is aligned with the energy level $E_1$(QBT12) in the base of the second transistor QBT12 so that only the second transistor QBT12 is turned on and the first transistor QBT11 is turned off, so that the output voltage $V_{out}$ is at the ground level, i.e., low level.

Accordingly, the circuit shown in FIG. 11 provides an inverted signal in response to the input signal. Thus, the circuit operates as an inverter.

If the base width $L_{B1}$ of the first transistor QBT11 is not selected to be between $L_{B2}$ and $L_{BX}$, the circuit shown in FIG. 11 will not operate as an inverter.

When the input voltage $V_{in}$ does not correspond to the voltage $V_1$ or $V_2$, no direct current flows through the inverter circuit. Therefore, the circuit has an advantage wherein no direct current power consumption such as in the well known complementary metal oxide semiconductor (CMOS) FET circuitry. The circuit according to this eleventh embodiment consists of two transistors having the same conductivity type. Nevertheless, no transition current flows through the transistors when the input voltage $V_{in}$ changes between the voltages $V_1$ and $V_2$.

Further, the circuit according to this eleventh embodiment can be easily manufactured based on one of the before-described ten embodiments. In the eleventh embodiment, two quantum base transistors having different base widths are manufactured by applying an MBE process twice, and so forth, to grow the different bases.

From the foregoing description, it will be apparent that, according to the present invention, a semiconductor device capable of transmitting minority carriers therethrough at an ultra high speed by resonant tunneling can be obtained. According to an experiment, the speed was between 0.1 and 1 picosecond for a quantum base transistor of the present invention. In comparison, in a conventional Josephson element, the speed for transferring signals is about several picoseconds. Also, in a conventional high electron mobility transistor (HEMT), the speed is about ten picoseconds.

Further, according to the present invention, because the minority carriers of the base can transfer from the emitter through the base to the collector only when the energy level of the carriers is aligned with any one of the discrete energy levels in the base, the power consumption in the semiconductor device of the present invention is very small.

Still further, the semiconductor device according to the present invention has the remarkable nonlinear characteristic which is effective for realizing not only conventional binary logic circuits but also highly functional logic circuits such as multi-value logic circuits.

Still further, by causing the emitter to have an energy gap greater than the energy gap in the base, invalid base currents can be prevented and the current amplification factor of the semiconductor device of the present invention increased.

Still further, by connecting two quantum base transistors having different base widths, an inverter operating at an ultra high speed and with a small power consumption can be obtained.

I claim:

1. A semiconductor device comprising:
    an n-type collector region having a conduction band having a first electron energy level;
    a collector barrier region formed contacting said collector region, having a thickness capable of allowing tunneling therethrough, having a conduction band having a second electron energy level higher than said first electron energy level;
    a base region formed of a semiconductor having a p-type conductivity, formed contacting said collector barrier region, having a base width capable of generating discrete energy levels for minority carriers in said base region, and having a conduction band having a third electron energy level lower than said second electron energy level;
    an emitter barrier region formed contacting said base region, having a thickness capable of allowing tunneling therethrough, and having a conduction band having a fourth electron energy level higher than said third electron energy level;
    an n-type emitter region formed contacting said emitter barrier region, for supplying minority carriers to said base region through said emitter barrier region and having a conduction band having a fifth electron energy level lower than said fourth electron energy level;

a first potential barrier to said minority carriers existing between said collector region and said base region;

a second potential barrier to said minority carriers existing between said base region and said emitter region; and bias means for controlling the relative potentials of said emitter and base regions such that said minority carriers are transferred by tunneling from said emitter region via at least one of said discrete energy levels in said base region to said collector region.

2. A semiconductor device as set forth in claim 1 wherein said emitter, base and collector regions of said semiconductor device form a first transistor, and wherein said semiconductor device further comprises a second transistor having the same structure as said first transistor, the discrete energy levels in said base region of said second transistor being different from the discrete energy levels in said base region of said first transistor, said first transistor and said second transistor being connected in series.

3. A semiconductor device as set forth in claim 1, wherein said bias means aligning the electron energy level of said conduction band of said emitter region with any one of said discrete energy levels in said base region.

4. A semiconductor device as set forth in claim 1, wherein said emitter region, said emitter potential barrier region, said base region, said collector potential barrier region, and said collector region are formed of AlGaAs, the amount of Al per unit volume in said emitter potential barrier region being different from the amount of Al per unit volume in said base region.

5. A semiconductor device as set forth in claim 1, wherein said emitter region being formed of InSb, said emitter potential barrier region being formed of CdTe, said base region being formed of InSb, said collector potential barrier region being formed of CdTe, and said collector region being formed of InSb.

6. A semiconductor device as set forth in claim 1, wherein said emitter region being formed of n-type Si, said emitter potential barrier region being formed of $SiO_2$, said base region being formed of p-type Si, and said collector region being formed of n-type Si.

7. A semiconductor device as set forth in claim 2, wherein said first transistor has a base length larger than that of said second transistor, and the second energy level of said base region of said first transistor is higher than the first energy level of said base region of said second transistor.

8. A semiconductor device as set forth in claim 7, wherein said first and second transistors being connected at a common connection point and in series between first and second voltage levels, and an input signal being provided in common at respective base regions, wherein the function of an inverter is provided by an output signal provided from said common connection point.

9. A semiconductor device as set forth in claim 1, wherein doping is provided so that depletion layers at the junctions of said base region and said emitter and collector potential barrier regions do not fill said base region.

10. A semiconductor device as set forth in claim 2, wherein each emitter region of each of said transistors has an energy gap greater than the energy gap of respective base regions.

11. A semiconductor device as set forth in claim 1, wherein said emitter and collector potential barrier regions being formed of an insulator.

12. A semiconductor device as set forth in claim 1, wherein said emitter and collector potential barrier regions being formed of a conductor.

13. A semiconductor device as set forth in claim 1, having a nonlinear transfer characteristic comprising a plurality of separated current peaks when the current of said minority carriers tunneling from said emitter region to said collector region is plotted against the voltage difference between said emitter and base regions.

14. A semiconductor device comprising:

a p-type collector region having a valence band having a first hole energy level;

a collector barrier region formed contacting said collector region, having a thickness capable of allowing tunneling therethrough, and having a valence band having a second hole energy level higher than said first hole energy level;

a base region formed of a semiconductor having an n-type conductivity, formed contacting said collector barrier region, having a base width capable of generating discrete energy levels for minority carriers in said base region, and having a valence band having a third hole energy level lower than said second hole energy level;

an emitter barrier region formed contacting said base region, having a thickness capable of allowing tunneling therethrough, and having a valence band having a fourth hole energy level higher than said third hole energy level;

an emitter region formed contacting said emitter barrier region, for supplying minority carriers to said base region through said emitter barrier region and having a valence band having a fifth hole energy level lower than said fourth hole energy level;

a first potential barrier to said minority carriers existing between said collector region and said base region;

a second potential barrier to said minority carriers existing between said base region and said emitter region; and bias means for controlling the relative potentials of said emitter and base regions such that such minority carriers are transferred by tunneling from said emitter region via at least one of said discrete energy levels in said base region to said collector region.

15. A semiconductor device as set forth in claim 14, wherein said emitter, base and collector regions of said semiconductor device form a first transistor, and wherein said semiconductor device further comprises a second transistor having the same structure as said first transistor except that the discrete energy levels in said base region of said second transistor being different from the discrete energy levels in said base region of said first transistor, said first transistor and said second transistor being connected in series.

16. A semiconductor device as set forth in claim 14, wherein said bias means aligning the hole energy level of said valence band of said emitter region with any one of said discrete energy levels in said base region.

17. A semiconductor device as set forth in claim 14 wherein said base region having a thickness in the range between 20 Å and 200 Å, said emitter potential barrier having a thickness in the range between 10 Å and 200

Å, and said collector potential barrier having a thickness in the range between 10 Å and 200 Å.

18. A semiconductor device as set forth in claim 14, wherein said emitter region is formed of p-type GaAs, said emitter barrier region is formed of n-type AlGaAs, said base region is formed of n-type GaAs, said collector barrier region is formed of n-type AlGaAs and said collector region is formed of p-type GaAs.

19. A semiconductor device as set forth in claim 14, wherein said emitter region being formed of p-type GaAs, said emitter potential barrier being formed of an intrinsic semiconductor, said base region being formed of n-type GaAs, said collector potential barrier region being formed of an intrinsic semiconductor, and said collector region being formed of p-type GaAs.

20. A semiconductor device as set forth in claim 14, wherein said emitter being formed of Ge, said emitter potential barrier region being formed of GaAs, said base being formed of Ge, said collector potential barrier region being formed of GaAs, and said collector region being formed of Ge.

21. A semiconductor device as set forth in claim 14, wherein said emitter being formed of SiGe, said emitter barrier region being formed of Si, said base region being formed of SiGe, said collector barrier region being formed of Si, and said collector region being formed of SiGe.

22. A semiconductor device as set forth in claim 14, wherein said emitter region, said emitter potential barrier region, said base region, said collector potential barrier region, and said collector region being formed of AlGaAs, the amount of Al per unit volume in said emitter potential barrier region being different from the amount of Al per unit volume in said base region.

23. A semiconductor device as set forth in claim 14, wherein said emitter region being formed of InSb, said emitter potential barrier region being formed of CdTe, said base region being formed of InSb, said collector potential barrier region being formed by CdTe, and said collector region being formed of InSb.

24. A semiconductor device as set forth in claim 14, wherein said emitter region being formed of p-type Si, said emitter potential barrier region being formed of $SiO_2$, said base region being formed of n-type Si, said collector potential barrier region being formed of $SiO_2$, and said collector region being formed of p-type Si.

25. A semiconductor device as set forth in claim 15, wherein said first transistor having a base length larger than that of said second transistor, and the second energy level of said base region of said first transistor being higher than the first energy level of said base region of said second transistor.

26. A semiconductor device as set forth in claim 25, wherein said first and second transistors being connected at a common connection point and in series between first and second voltage levels, and an input signal being provided in common at said respective base regions, wherein the function of an inverter is provided by an output signal provided from said common connection point.

27. A semiconductor device as set forth in claim 14, wherein doping is provided so that depletion layers at the junctions of said base region and said emitter and collector potential barrier regions do not fill said base region.

28. A semiconductor device as set forth in claim 15, wherein each emitter region of each of said transistors has an energy gap greater than the energy gap of respective base regions.

29. A semiconductor device as set forth in claim 14, wherein said emitter and collector potential barrier regions being formed of an insulator.

30. A semiconductor device as set forth in claim 14, wherein said emitter and collector potential barrier regions being formed of a semiconductor.

31. A semiconductor device as set forth in claim 14, having a nonlinear transfer characteristic comprising a plurality of separated current peaks when the current of said minority carriers tunneling from said emitter region to said collector region is plotted against the voltage difference between said emitter and base regions.

32. A semiconductor device as set forth in claim 1, wherein said base region has a thickness in the range between 20 Å and 200 Å, said second potential barrier has a thickness in the range between 10Å and 200 Å, and said first potential barrier has a thickness in the range between 10Å and 200Å.

33. A semiconductor device as set forth in claim 1, wherein said emitter region formed by n-type GaAs, said emitter barrier region is formed by p-type AlGaAs, said base region is formed by p-type GaAs, said collector potential barrier region is formed by p-type AlGaAs, and said collector region is formed by n-type GaAs.

34. A semiconductor device as set forth in claim 1, wherein said emitter region is formed by n-type GaAs, said emitter barrier region is formed by an intrinsic semiconductor, said base region is formed by p-type GaAs, said collector barrier region is formed by an intrinsic semiconductor, and said collector region is formed by n-type GaAs.

35. A semiconductor device as set forth in claim 1, wherein said emitter region is formed of Ge, said emitter barrier region is formed of GaAs, said base region is formed of Ge, said collector barrier region is formed of GaAs, and said collector region is formed of Ge.

36. A semiconductor device as set forth in claim 1, wherein said emitter region is formed of SiGe, said emitter barrier region is formed of Si, said base region is formed of SiGe, said collector barrier region is formed of Si, and said collector region is formed of SiGe.

37. A semiconductor device as set forth in claim 1, wherein said emitter region is formed of InAs, said emitter barrier region is formed of GaSb, said base region is formed of SnAs, said collector barrier region is formed of GaSb, and said collector region is formed of InAs.

38. A semiconductor device as set forth in claim 1, having an current amplification factor in the range of from 3000 to 5000.

39. A semiconductor device as set forth in claim 1, having a speed in the range of from 0 to 0.1 picoseconds.

* * * * *

UNITED STATES PATENT AND TRADEMARK OFFICE
CERTIFICATE OF CORRECTION

PATENT NO. : 4,958,201
DATED : SEPTEMBER 18, 1990
INVENTOR(S) : TAKASHI MIMURA

It is certified that error appears in the above-identified patent and that said Letters Patent is hereby corrected as shown below:

Col. 8, line 19, "(4)" should be --(3)--;

line 20, "(5)" should be --(4)--.

Col. 15, line 44, "Si, and" should be --Si, said collector potential barrier region being formed of $SiO_2$, and--.

Signed and Sealed this

Twenty-fourth Day of December, 1991

Attest:

HARRY F. MANBECK, JR.

*Attesting Officer*  *Commissioner of Patents and Trademarks*